(12) United States Patent
Hossain et al.

(10) Patent No.: US 9,268,724 B2
(45) Date of Patent: Feb. 23, 2016

(54) CONFIGURATION OF DATA STROBES

(71) Applicant: INTEL CORPORATION, Santa Clara, CA (US)

(72) Inventors: Md Altaf Hossain, Portland, OR (US); Kevin J. Doran, North Plains, OR (US); Nagi Aboulenein, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/182,053

(22) Filed: Feb. 17, 2014

(65) Prior Publication Data

US 2014/0317343 A1    Oct. 23, 2014

Related U.S. Application Data

(63) Continuation of application No. 13/535,278, filed on Jun. 27, 2012, now Pat. No. 8,683,096.

(51) Int. Cl.
*G06F 3/00* (2006.01)
*G06F 13/16* (2006.01)
*G11C 7/10* (2006.01)
*G11C 7/22* (2006.01)

(52) U.S. Cl.
CPC ........ *G06F 13/1689* (2013.01); *G06F 13/1684* (2013.01); *G11C 7/1069* (2013.01); *G11C 7/1072* (2013.01); *G11C 7/1093* (2013.01); *G11C 7/22* (2013.01); *G11C 2207/229* (2013.01); *G11C 2207/2281* (2013.01); *Y02B 60/1228* (2013.01)

(58) Field of Classification Search
USPC .............................. 710/32, 107; 713/320, 324
See application file for complete search history.

(56) References Cited

U.S. PATENT DOCUMENTS

2001/0037421 A1\* 11/2001 Singh et al. ................... 710/126
2007/0033313 A1    2/2007 Gaskins
2012/0069687 A1    3/2012 Koshizuka \* cited by examiner

*Primary Examiner* — Hoai V Ho
(74) *Attorney, Agent, or Firm* — Schwabe, Williamson & Wyatt, P.C.

(57) ABSTRACT

Disclosed embodiments may include a circuit having a plurality of data terminals, no more than two pairs of differential data strobe terminals associated with the plurality of data terminals, and digital logic circuitry. The digital logic circuitry may be coupled to the data terminals and configured to use the no more than two pairs of differential data strobe terminals concurrently with the plurality of data terminals to transfer data. Other embodiments may be disclosed.

23 Claims, 4 Drawing Sheets

CONFIGURATION OF DATA STROBES

CROSS REFERENCE TO RELATED APPLICATIONS

The present application is a continuation of U.S. patent application Ser. No. 13/535,278, filed Jun. 27, 2012, entitled "CONFIGURATION OF DATA STROBES," the entire disclosure of which is hereby incorporated by reference.

TECHNICAL FIELD

Embodiments of the present disclosure relate generally to a configuration of data strobes.

BACKGROUND INFORMATION

Memory controllers may communicate with memory through a variety of synchronous signals, such as clock signals, data signals, address signals, and strobe signals. Each signal may occupy a dedicated terminal in the memory controller and memory device. Each signal may also be transferred between the memory controller and the memory device by a dedicated circuit board trace. Each dedicated terminal and circuit board trace consumes silicon real estate or otherwise places constraints on the minimize size of the system, due to trace routing.

BRIEF DESCRIPTION OF THE DRAWINGS

Embodiments of the invention are illustrated by way of example, and not by way of limitation, in the figures of the accompanying drawings in which like reference numerals refer to similar elements.

DESCRIPTION OF THE EMBODIMENTS

Embodiments of the present disclosure may relate to configurations of data strobe lines and/or terminals. According to one embodiment, a memory controller or a double data rate dynamic random access memory (DDR DRAM) memory device may have a plurality of data terminals and a plurality of differential strobe terminals. In embodiments, the memory controller and the DDR DRAM memory device may include no more than two pairs of strobe terminals for every 64 data terminals. According to another embodiment, the memory controller may be configured to selectively reduce use of all available data strobe lines and/or terminals. Less data strobes may advantageously enable size reduction of a memory controller, a memory device, and an interconnecting printed circuit board that couples the memory controller to the memory device.

Various aspects of the illustrative embodiments will be described using terms commonly employed by those skilled in the art to convey the substance of their work to others skilled in the art. It will be apparent to those skilled in the art, however, that some alternate embodiments may be practiced using portions of the described aspects. For purposes of explanation, specific numbers, materials, and configurations are set forth in order to provide a thorough understanding of the illustrative embodiments. It will be apparent to one skilled in the art, however, that alternate embodiments may be practiced without the specific details. In other instances, well-known features are omitted or simplified in order to not obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
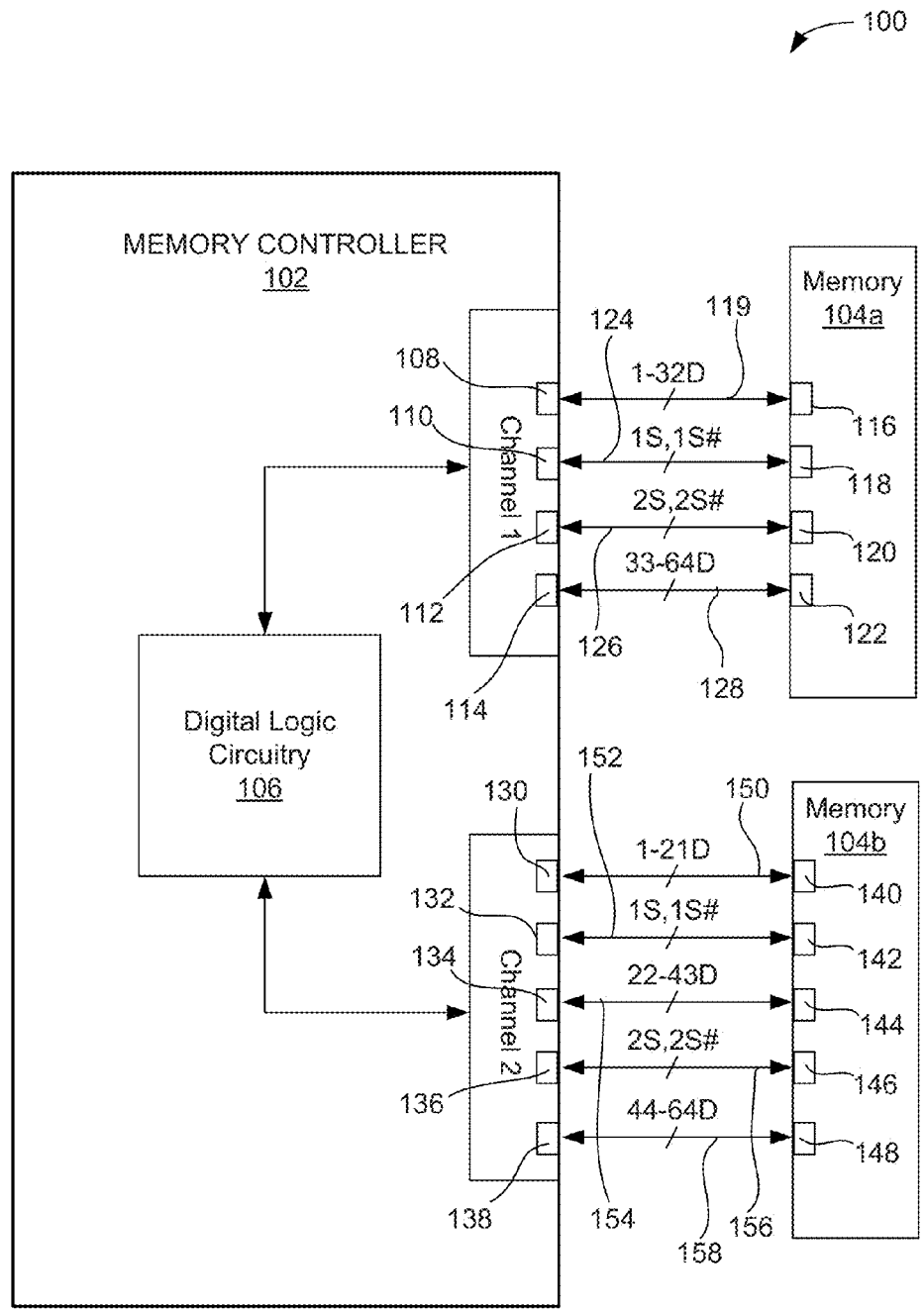
FIG. 1 describes a block diagram of a computing system including a memory controller, according to various embodiments of the present disclosure.

FIG. 1 illustrates a computing system 100 suitable for practicing embodiments of the present disclosure. Computing system 100 may include a memory controller 102 configured to transmit various synchronous signals to memory 104a and 104b (collectively 104).

Memory controller 102 may be configured to provide various data and control signals to memory 104. Memory controller 102 may include digital logic circuitry 106, a first communication channel, i.e., Channel 1, and a second communication channel, i.e., Channel 2. Digital logic circuitry 106 may be configured to transfer data and control signals to and from Channel 1 and Channel 2.

Channel 1 may be configured to communicate data to memory 104a through a number of conductive terminals and conductive lines. Channel 1 may include a number of data terminals 108, a number of data strobe terminals 110, a number of data strobe terminals 112, and a number of data terminals 114. Memory 104a may include a number of data terminals 116, a number of data strobe terminals 118, a number of data strobe terminals 120, and a number of data terminals 122. Data terminals 108 may be communicatively coupled to data terminals 116 via a data bus 119. Data bus 119 may be configured to carry signals for data lines 1-32D between memory controller 102 and memory 104a. Data strobe terminals 110 may be communicatively coupled to data strobe terminals 118 via a data strobe bus 124. Data strobe bus 124 may be configured to carry differential strobe signals for a differential data strobe signal pair 1S, 1S# (hereinafter, data strobe pair 1S, 1S#). Data strobe terminals 112 may be communicatively coupled to data strobe terminals 120 via a data strobe bus 126. Data strobe bus 126 may be configured to carry differential data signals for a differential data strobe signal pair 2S, 2S# (hereinafter, data strobe pair 2S, 2S#). Data terminals 114 may be communicatively coupled to data terminals 122 via data bus 128. Data bus 128 may be configured to carry signals for data lines 33-64D between memory controller 102 and memory 104a.

According to embodiments, memory controller 102 may include data strobe terminals 110 and data strobe terminals 112 to accommodate data strobe pair 1S, 1S# and data strobe pair 2S, 2S#, without any additional data strobe pair terminals in Channel 1. In embodiments, computer system 100 may include data strobe bus 124 and data strobe bus 126 without any additional data strobe buses associated with Channel 1. According to other embodiments, data strobe pair 1S, 1S# and data strobe pair 2S, 2S# may be positioned or disposed in between data bus 119 and data bus 128. For example, data strobe pair 1S, 1S# and data strobe pair 2S, 2S# may be disposed or positioned at or near a center of data bus 119 and data bus 128.

Traditional techniques used to interface a memory controller with DDR DRAM include the use of one pair of data strobe lines for every 4 data lines or for every 8 data lines. Thus, using traditional techniques, a computing system manufacturer may use 8 or 16 pairs of differential data strobe lines for every 64 data lines. In accordance with embodiments of the present disclosure, computing system 100 may reduce the number of strobe lines or strobe pairs to a one-fourth or one-eighth of the number of strobe lines or strobe pairs traditionally used.

The configuration of computing system 100 offers many advantages over traditional data strobe pair configurations between a memory controller and memory, e.g., DDR DRAM. For example, by using data strobe pair 1S, 1S# and data strobe pair 2S, 2S# without additional data strobe pairs in Channel 1, computing system 100 may decrease power consumption by 0.25 watts. Thus, if the configuration of Channel 1 is also used for Channel 2, computing system 100 may decrease power consumption by 0.5 watts over traditional data strobe pair configurations. Furthermore, employing data strobe pair 1S, 1S# and data strobe pair 2S, 2S# without additional data strobe pairs in Channel 1, 12-16 data strobe terminals may be omitted in the design of memory controller 102 as well as from memory 104a to provide a decrease in used silicon real estate. With the decrease in silicon real estate, memory controller 102 and memory 104a may be manufactured with smaller form factors to enable a manufacturer to decrease the overall size of the electronic device into which computing subsystem 100 will be placed. The decreased form factor and decreased power consumption of computing system 100 may enable electronic systems or devices, into which computing system 100 is placed, to be made smaller and run longer than devices employing traditional data strobe pair configurations.

Channel 2 may be configured to communicate data to memory 104b through a number of conductive terminals and conductive lines. Channel 2 may include a number of data terminals 130, a number of data strobe terminals 132, and number of data terminals 134, a number of data strobe terminals 136, and a number of data terminals 138. Memory 104b may include a number of data terminals 140, a number of data strobe terminals 142, and number of data terminals 144, a number of data strobe terminals 146, and a number of data terminals 148. Data terminals 130 may be communicatively coupled to data terminals 140 via data bus 150. Data bus 150 may be configured to carry signals for data lines 1-21D between memory controller 102 and memory 104b. Data strobe terminals 132 may be communicatively coupled to data strobe terminals 142 via data strobe bus 152. Data strobe bus 152 may be configured to carry differential data strobe signal pair 1S, 1S#. Data terminals 134 may be communicatively coupled to data terminals 144 via data bus 154. Data bus 154 may be configured to carry signals for data lines 22-43D between memory controller 102 and memory 104b. Data strobe terminals 136 may be communicatively coupled to data strobe terminals 146 via data strobe bus 156. Data strobe bus 156 may be configured to carry differential data strobe signal pair 2S, 2S#. Data terminals 138 may be communicatively coupled to data terminals 148 via data bus 158. Data bus 158 may be configured to carry signals for data lines 44-64D between memory controller 102 and memory 104b.

As described, each data strobe bus 152 and 156 may be interleaved between data buses 150, 154, and 158, according to various embodiments. According to other embodiments, data strobe buses 152 and 156 may positioned data buses that are grouped with more or less consecutive data lines. For example, data strobe bus 152 may be positioned between a first data bus having 10 data lines and a second data bus having 35 data lines. Other combinations are within the scope of the disclosure. Accordingly, the configuration of Channel 2 provides a variation of the configuration of Channel 1 while also providing the power savings benefits and real estate benefits described above in connection with Channel 1.

According to embodiments, DDR DRAM may be DDR2, DDR3, or other double data rate synchronous dynamic random access memory.

Figure 2:
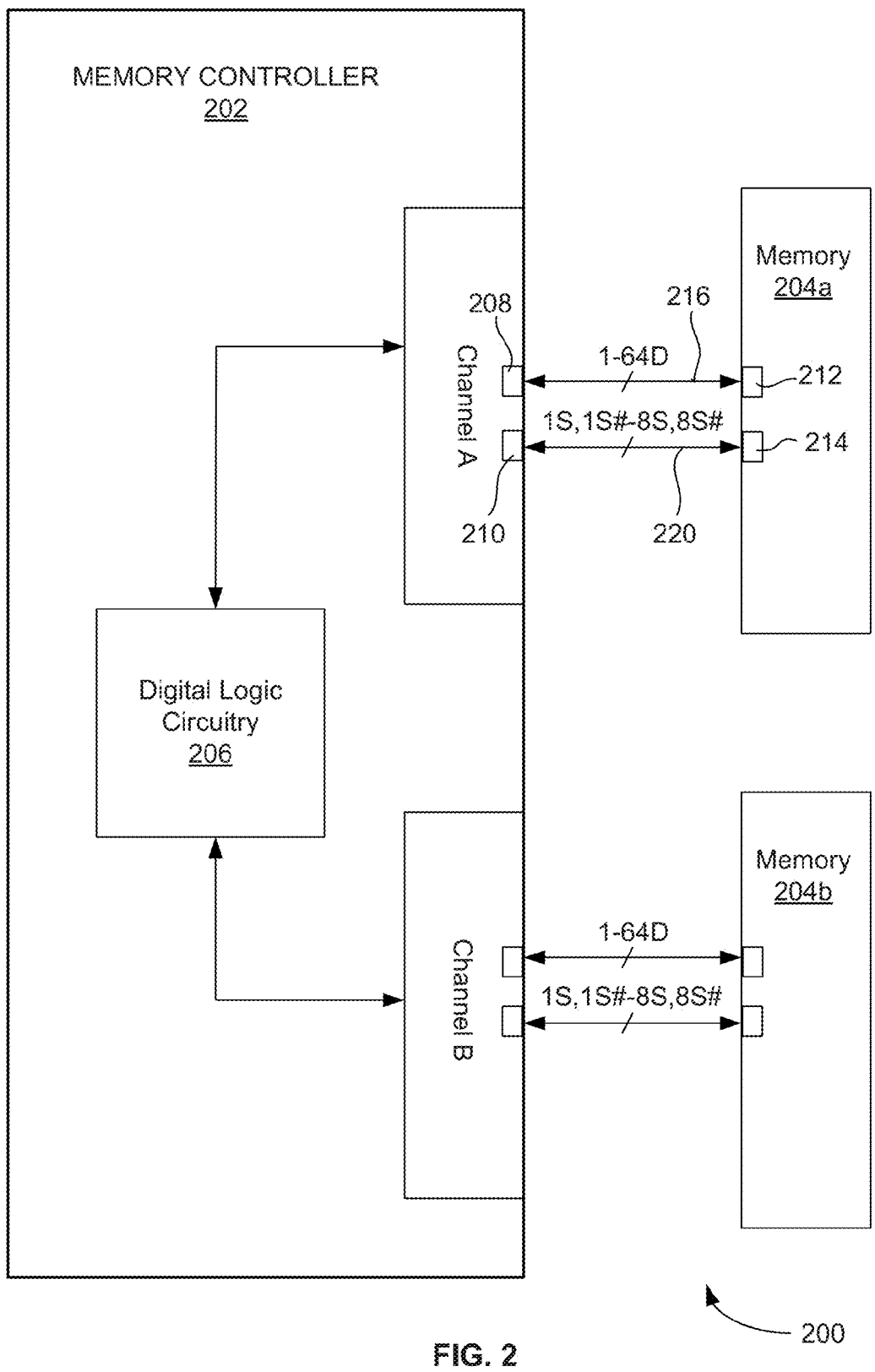
FIG. 2 describes a block diagram of a memory controller, according to various embodiments of the present disclosure.

FIG. 2 illustrates a computing system 200, according to various embodiments of the disclosure. Computing system 200 includes memory controller 202 communicatively coupled to memory 204a and memory 204b.

Memory controller 202 may be configured to selectively reduce the number of data strobe terminals used to transfer data between memory controller 202 and memory 204a and/ or 204b. Memory controller 202 may include digital logic circuitry 206, a first communication channel Channel A, and a second communication channel Channel B.

Channel A may include a number of data terminals 208, and a number of data strobe terminals 210. Memory 204a may include a number of data terminals 212 and a number of data strobe terminals 214. Data terminals 208 may be communicatively coupled to data terminals 212 via data bus 216. Data bus 216 may be configured to carry signals for data lines 1-64D between memory controller 202 and memory 204a. Data strobe terminals 210 may be communicatively coupled to data strobe terminals 214 via data strobe bus 220. Data strobe bus 220 may be configured to carry 8 differential data strobe signal pairs 1S, 1S#-8S-8S#.

According to various embodiments, data strobe bus 220 may be disposed or positioned around a center of data bus 216, such that approximately 32 data line of data bus 216 are positioned on either side of data strobe bus 220. According to other embodiments, the data strobe lines of data strobe bus 220 may be interleaved between the data lines of data bus 216. In embodiments, data bus 216 may include 64 data lines. Alternatively, data bus 216 may include more or less than 64 data lines. While, data strobe bus 220 is described as including 8 pairs of data strobe lines, data strobe bus 220 may include more or less than 8 pairs of data strobe lines, according to various embodiments.

Channel B and memory 204b may be configured in a manner similar to the configuration described for Channel A.

Digital logic circuitry 206 may enable memory controller 202 to selectively reduce a number of strobe line pairs operated by memory controller 202 in order to reduce an amount of power consumed by computing system 200. In embodiments, memory controller 202 may receive instructions to enter a low power mode. In response to instructions to enter the low power mode, digital logic circuitry 206 may discontinue operation of one or more pairs of data strobe lines within data strobe bus 220. For example, in response to instructions to enter a low power mode, digital logic circuitry 206 may disable Channel A from using 6 of the 8 pairs of data strobe lines within data strobe bus 220. Alternatively, digital logic circuitry 206 may selectively disable Channel A from using 4 of the 8 pairs of data strobe lines within data strobe bus 220. Digital logic circuitry 206 may be configured to selectively increase and decrease the number of data strobe lines or terminals used by computing system 200 based on a power mode received by memory controller 202.

Figure 3:
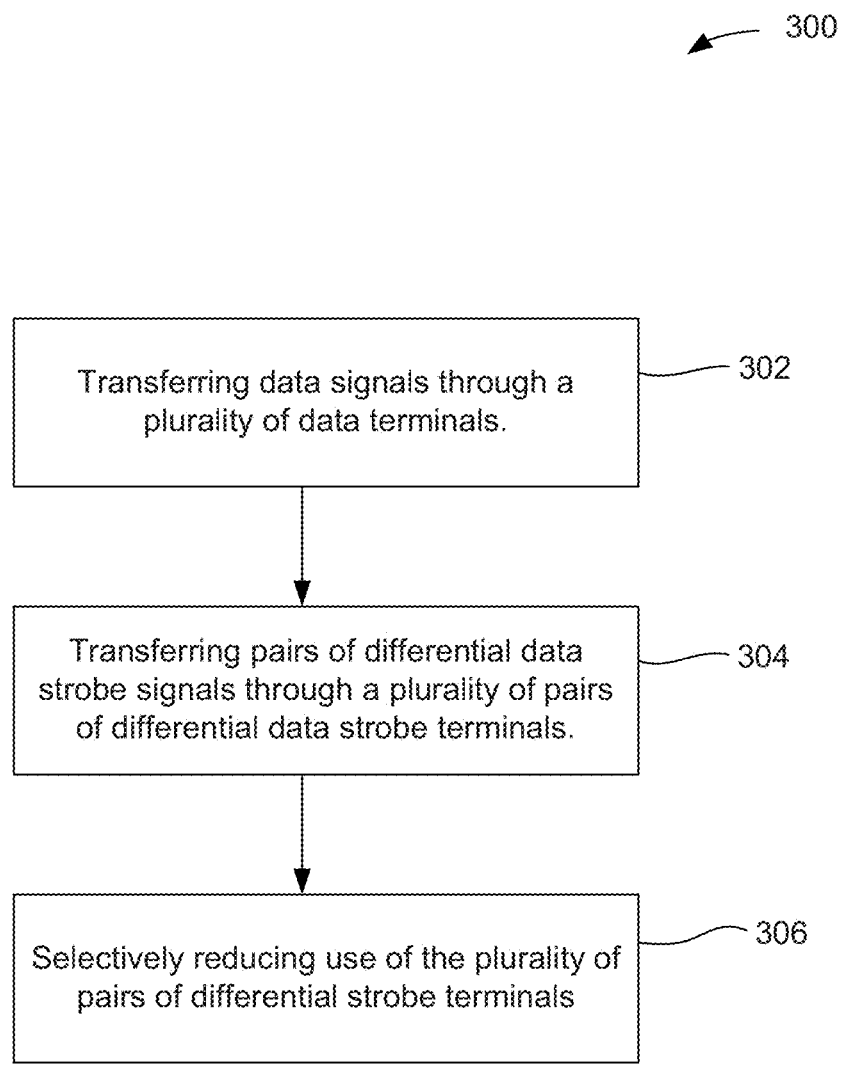
FIG. 3 describes a flow chart of an operation of the memory controller of FIG. 2, according to various embodiments of the present disclosure.

FIG. 3 illustrates an embodiment of a method 300 of operating a computing system 200.

At block 302, a memory controller transfers data signals through a plurality of data terminals. The memory controller may transfer the data signals to one or more memory devices. In embodiments, memory devices may be DDR DRAM devices. The plurality of data terminals may be associated with a single channel of the memory controller. The plurality of data terminals may include 64 or more data terminals associated with the channel.

At block 304, the memory controller may transfer pairs of differential data strobe signals through a plurality of pairs of differential data strobe terminals. The memory controller may transfer the differential data strobe signals to and from one or more memory devices. In embodiments, the memory controller may include 2 or more pairs of data strobe terminals. In one embodiment, the memory controller may include 8 pairs of data strobe terminals.

At block 306, the memory controller may selectively reduce use of the plurality of pairs of differential strobe terminals. For example, the controller may receive a command from a processor to enter a low-power mode. In response, the memory controller may disable use of one or more pairs of data strobe terminals to reduce power consumption by the memory controller and the one or more memory devices. According to one embodiment, none memory controller may be configured to transmit one or more instructions or signals to cause the one or more memory devices to enter a low power mode and to disable use of one or more data strobe terminals of the one or more memory devices.

Figure 4:
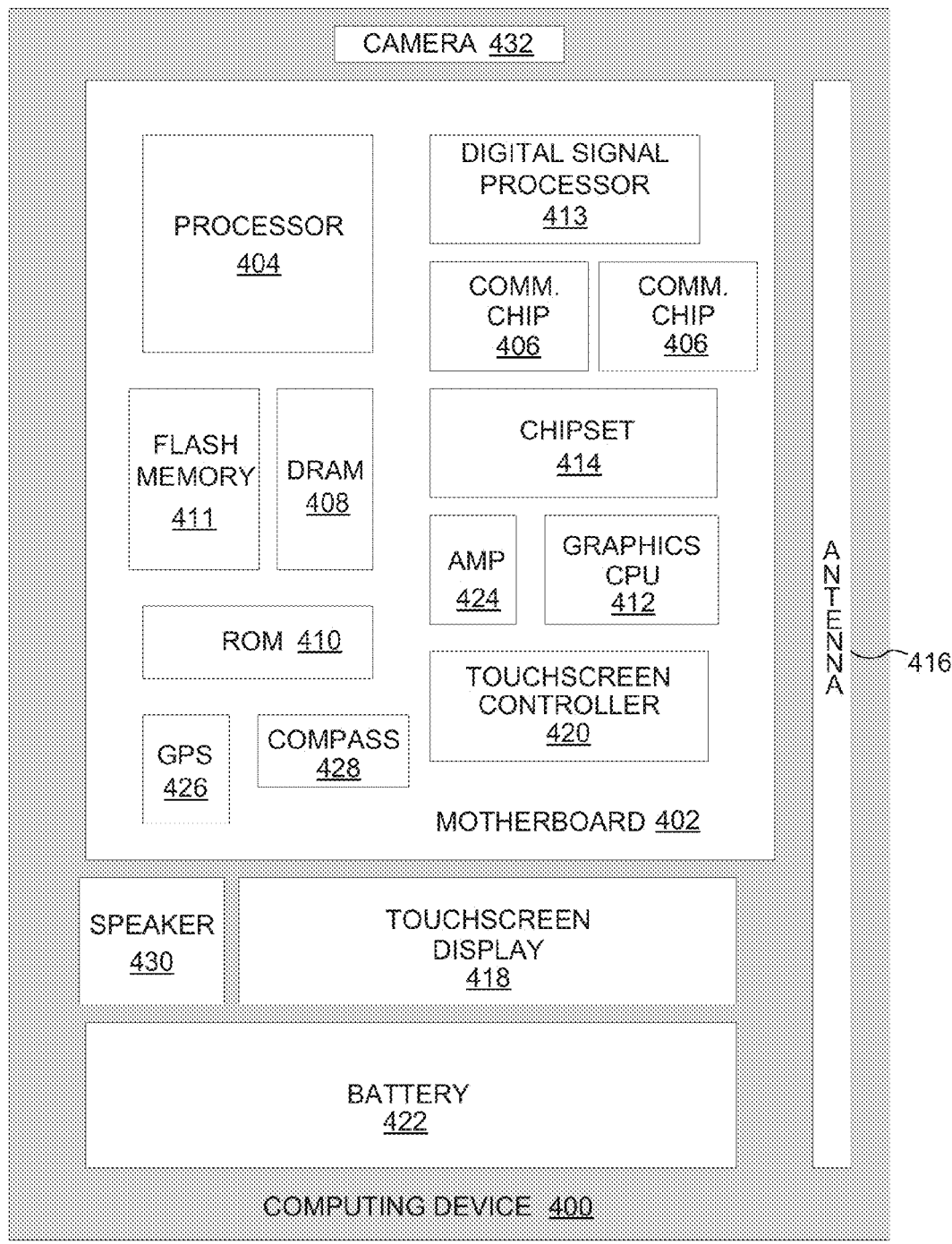
FIG. 4 describes a block diagram of an implementation of the memory controller of FIG. 1 or FIG. 2, according to various embodiments of the present disclosure.

FIG. 4 illustrates a computing device 400 in accordance with one implementation of an embodiment of the invention. The computing device 400 houses a board 402. The board 402 may include a number of components, including but not limited to a processor 404 and at least one communication chip 406. The processor 404 may be physically and electrically coupled to the board 402. In some implementations the at least one communication chip 406 may also be physically and electrically coupled to the board 402. In further implementations, the communication chip 406 may be part of the processor 404.

Depending on its applications, computing device 400 may include other components that may or may not be physically and electrically coupled to the board 402. These other components include, but are not limited to, volatile memory (e.g., DRAM 408), non-volatile memory (e.g., ROM 410), flash memory 411, a graphics processor 412, a digital signal processor 413, a crypto processor, a chipset 414, an antenna 416, a display, a touchscreen display 418, a touchscreen controller 420, a battery 422, an audio codec, a video codec, a power amplifier 424, a global positioning system (GPS) device 426, a compass 428, an accelerometer, a gyroscope, a speaker 430, a camera 432, and a mass storage device (such as hard disk drive, compact disk (CD), digital versatile disk (DVD), and so forth).

According to various embodiments, chipset 414 may include memory controller 102 or 202. According to embodiments, DRAM 408 may be memory 104 or 204.

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the disclosure, the integrated circuit die of the processor includes one or more devices, such as memory controller 102 or 202 operably configured according to embodiments of the disclosure. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406.

In further implementations, another component housed within the computing device 400 may contain an integrated circuit die that includes one or more devices, such as processor cores, cache and one or more memory controllers.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

According to various embodiments, an apparatus may include a number of data terminals, wherein the number of data terminals may include at least 64 bi-directional data terminals; no more than two pairs of differential data strobe terminals associated with the number of data terminals and configured to transfer data strobe signals; and digital logic circuitry coupled to the data terminals and configured to use the no more than two pairs of differential data strobe terminals concurrently with the number of data terminals to transfer data. The no more than two pairs of differential data strobe terminals may consist of one pair of differential data strobe terminals. The no more than two pairs of differential data strobe terminals may be positioned on the apparatus to facilitate routing data strobe lines, coupled to the two or less pairs of differential data strobe terminals, near a center of a data bus coupled to the number of data terminals. The apparatus may be either a dynamic random access memory (DRAM) device or a memory controller. The DRAM device may be a type of double data rate (DDR) DRAM device. The memory controller may be an integrated portion of a computer processor.

According to various embodiments, memory controller may include a number of data terminals, wherein the number of data terminals are bi-directional; a number of pairs of differential data strobe terminals associated with the number of data terminals and configured to transfer data strobe signals; and digital logic circuitry coupled to the number of data terminals and configured to use the number of pairs of differential data strobe terminals concurrently with the number of data terminals to transfer data, the digital logic circuitry further configured to reduce power consumed by the memory controller by selectively reducing use of the number of pairs of differential data strobe terminals to transfer data to a number of the number of pairs of differential data strobe terminals that is less than all of the number of pairs of differential data strobe terminals. The digital logic circuitry may be configured to selectively reduce use of the number of pairs of differential data strobe terminals, based on a power mode of the memory controller.

According to embodiments, the number of bi-directional data terminals may include at least 64 bi-directional data terminals. The number of pairs of differential data strobe terminals may include at least 8 pairs of differential data strobe terminals. The number that is less than all of the number of pairs may be 2 pairs of differential strobe terminals. The memory controller may be an integrated portion of a computer processor. The data strobe terminals are configured to enable transfer of the data between the memory controller and double data rate synchronous dynamic ram (DDR SDRAM).

According to various embodiments, a system may include a printed circuit board; one or more processors coupled to the printed circuit board; a memory interface coupled to the printed circuit board and configured to receive one or more synchronous dynamic random access memory (SDRAM) devices; and a number of data traces disposed on the printed circuit board between the one or more processors and the memory interface. The number of traces may be configured to electrically couple data terminals of the one or more processors with data terminals of the memory interface. The number of data traces may include at least 64 data traces. The system may include a number of data strobe traces disposed on the printed circuit board and configured to electrically couple the one or more processors to the memory interface. The number of data strobe traces may include no more than 4 data strobe traces for every 64 data traces. The system may include a network interface configured to communicatively couple the system with a network.

According to embodiments, the number of data traces may be disposed on the printed circuit board in parallel as a data bus. The number of data traces may be disposed in parallel to the number of data traces and near a center of the data bus. Each of the no more than 4 data strobe traces may be separated by at least one of the number of data traces. The one or more processors may include a stand-alone memory controller.

According to embodiments, The one or more processors may include a memory controller integrated into a computer processor operable to execute a software operating system.

In embodiments, the system may be a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder. The system may further include a display device operatively coupled with the one or more processors. The display device may be a touch screen.

According to various embodiments, a method may include transferring data signals, with a memory controller, through a number of data terminals, wherein the data terminals include at least 64 data terminals. The method may include transferring pairs of differential data strobe signals, with the memory controller, through a number of pairs of differential data strobe terminals. The method may include reducing a power consumption of the memory controller by selectively reducing use of the number of pairs of differential data strobe terminals to a number of the number of pairs that is less than all of the number of pairs to transfer data.

The method may further include determining a power mode of the memory controller. Reducing the power consumption may include reducing the use of the number of pairs of differential data strobe terminals based on the power mode. The number of the number of pairs may be one pair or two pairs of data strobe terminals. The memory controller may be an integrated portion of a computer processor.

The above description of illustrated implementations of the disclosure, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Specific features of any of the above described embodiments may be fully or partially combined with one or more other embodiments, either wholly or partially, to form new embodiments of the disclosure.

What is claimed is:

1. An apparatus, comprising:
a plurality of bi-directional data terminals, wherein the plurality of bi-directional data terminals includes at least 64 bi-directional data terminals;
a plurality of pairs of differential data strobe terminals, with a ratio of no more than 1 pair of differential data strobe terminals associated with each 16 of the bi-directional data terminals and configured to transfer data strobe signals; and
digital logic circuitry coupled to the bi-directional data terminals and the plurality of pairs of differential data strobe terminals, and configured to use at least some of the differential data strobe terminals with their associated bi-directional data terminals to transfer data.

2. The apparatus of claim 1, wherein the plurality of bi-directional data terminals includes at least 128 bi-directional data terminals, and the plurality of pairs of differential data strobe terminals includes no more than 8 pairs of differential data strobe terminals associated with the 128 bi-directional data terminals.

3. The apparatus of claim 2, wherein the digital logic circuitry is configured to perform a read operation by using half of the differential data strobe terminals associated with the bi-directional data terminals of the plurality of bi-directional data terminals through which data is transferred.

4. The apparatus of claim 1, wherein the plurality of bi-directional data terminals, the plurality of pairs of differential data strobe terminals, and the digital logic circuitry are part of a memory controller.

5. The apparatus of claim 4, wherein the memory controller is an integrated portion of a computer processor.

6. The apparatus of claim 5, wherein the memory controller is a discrete memory controller and is not an integrated portion of a computer processor.

7. The apparatus of claim 1, wherein the apparatus is a dynamic random access memory (DRAM) device.

8. The apparatus of claim 1, wherein the apparatus comprises:
a first channel that includes:
the plurality of bi-directional data terminals; and
the plurality of pairs of differential data strobe terminals; and
a second channel that includes:
a second plurality of second channel bi-directional data terminals, wherein the second plurality of second channel bi-directional data terminals includes at least 64 second channel bi-directional data terminals; and
a second plurality of pairs of second channel differential data strobe terminals, with a ratio of no more than 1 pair of second channel differential data strobe terminals associated with each 16 of the second channel bi-directional data terminals and configured to transfer data strobe signals; and
wherein the digital logic circuitry is coupled to the second channel bi-directional data terminals and the second plurality of pairs of second channel differential data strobe terminals, and configured to use the second channel differential data strobe terminals with their associated second channel bi-directional data terminals to transfer data.

9. A computer memory apparatus, comprising:
a plurality of data terminals, the plurality of data terminals including at least 64 data terminals; and
a plurality of pairs of differential data strobe terminals associated with the plurality of data terminals, with a ratio of no more than one pair of differential data strobe terminals per each 16 data terminals of the plurality of data terminals.

10. The computer memory apparatus of claim 9, wherein the computer memory apparatus comprises:
a first channel that includes:
the plurality of data terminals and
the plurality of pairs of differential data strobe terminals; and
a second channel that includes:
a second plurality of second channel data terminals, the second plurality of second channel data terminals including at least 64 second channel data terminals; and
a second plurality of pairs of second channel differential data strobe terminals associated with the second plurality of second channel data terminals, with a ratio of no more than one pair of second channel differential data strobe terminals per each 16 second channel data terminals of the second plurality of second channel data terminals.

11. The computer memory apparatus of claim 9, further comprising digital logic circuitry coupled to the plurality of data terminals and to the plurality of differential data strobe terminals, and configured to use at least some of the differential data strobe terminals with their associated data terminals to transfer data.

12. The computer memory apparatus of claim 11, wherein the plurality of data terminals, the plurality of data terminals, and the digital logic circuitry are part of a memory controller.

13. The computer memory apparatus of claim 12, wherein the memory controller is an integrated portion of a computer processor.

14. The computer memory apparatus of claim 12, wherein the memory controller is a discrete memory controller and is not an integrated portion of a computer processor.

15. The computer memory apparatus of claim 11, wherein the digital logic circuitry is configured to perform a write operation by using half of the differential data strobe terminals associated with the data terminals of the plurality of data terminals through which data is transferred for the write operation.

16. The computer memory apparatus of claim 9, wherein the plurality of data terminals includes at least 128 data terminals and wherein there are no more than 8 pairs of differential data strobe terminals associated with the 128 data terminals.

17. The computer memory apparatus of claim 16, wherein there are 8 pairs of differential data strobe terminals associated with the 128 data terminals, further comprising digital logic circuitry coupled to the 128 data terminals and to the 8 pairs differential data strobe terminals, and configured to use no more than 4 pairs of the differential data strobe terminals with the 128 associated data terminals to transfer data.

18. The computer memory apparatus of claim 9, wherein the computer memory apparatus is part of a system, the system comprising:
a volatile memory;
a memory controller;
a plurality of data lines communicably coupling the volatile memory to the memory controller, the plurality of data lines including at least 64 bi-directional data lines;
a plurality of data strobe lines communicably coupling the volatile memory to the memory controller, wherein there is a ratio of no more than 1 data strobe line for every 8 bi-directional data lines of the plurality of data lines; and
a network interface configured to communicatively couple the system with a network.

19. The computer memory apparatus of claim 18, wherein the plurality of data terminals and the plurality of pairs of differential data strobe terminals are part of the memory controller, the plurality of data terminals are connected to the plurality of data lines, the plurality of plurality of pairs of differential data strobe terminals are connected to the plurality of data strobe lines, the memory controller further comprising digital logic circuitry coupled to the plurality of data terminals and configured to use no more than 1 pair of differential data strobe terminals of the plurality of pairs of data strobe terminals for each 16 bi-directional data terminals of the plurality of bi-directional data terminals to transfer data.

20. The computer memory apparatus of claim 19, wherein the logic circuitry is configured to perform a write operation by applying data signals to a subset of the plurality of data terminals, the subset of the plurality of data terminals having no more than one pair of differential data strobe pair terminals associated with the subset of the plurality of data terminals for every 16 data terminals in the subset of the plurality of data terminals, and applying strobe signals to less than all the differential data strobe pair terminals associated with the subset of the plurality of data terminals, the strobe signals indicating when the data signals are valid.

21. A method of sending information to memory, comprising:
sending a plurality of data signals through a plurality of data terminals, wherein each data signal is sent through a different one of the plurality of data terminals, and wherein the plurality of data signals includes at least 64 data signals; and sending a plurality of pairs of differential data strobe signals through a plurality of pairs of differential data strobe terminals, wherein each pair of differential data strobe signals is sent through a different pair of the plurality of pairs of differential data strobe terminals, and wherein no more than 4 pairs of differential data strobe signals are sent for every 64 data signals.

22. The method of claim 21, wherein the plurality of data terminals includes at least 128 data terminals, and the plurality of data signals includes at least 128 data signals.

23. The method of claim 22, wherein no more than 4 pairs of differential strobe signals are sent associated with the 128 data signals, and there are 8 pairs of differential data strobe terminals associated with the 128 data terminals.

\* \* \* \* \*

UNITED STATES PATENT AND TRADEMARK OFFICE
CERTIFICATE OF CORRECTION

PATENT NO. : 9,268,724 B2
APPLICATION NO. : 14/182053
DATED : February 23, 2016
INVENTOR(S) : Md Altaf Hossain et al.

Page 1 of 1

It is certified that error appears in the above-identified patent and that said Letters Patent is hereby corrected as shown below:

In the Claims

Claim 17, Column 10,
Line 20, "...pairs differential..." should read -- pairs of differential --

Claim 19, Column 10,
Line 42, "...the plurality of plurality of pairs..." should read --the plurality of pairs--

Signed and Sealed this
Fifth Day of July, 2016

Michelle K. Lee
*Director of the United States Patent and Trademark Office*